United States Patent
Gu

(10) Patent No.: US 7,235,336 B1
(45) Date of Patent: Jun. 26, 2007

(54) METHOD FOR DETERMINING PHOTORESIST THICKNESS AND STRUCTURE FORMED USING DETERMINED PHOTORESIST THICKNESS

(75) Inventor: Yiming Gu, Hillsboro, OR (US)

(73) Assignee: Integrated Device Technology, Inc., San Jose, CA (US)

( * ) Notice: Subject to any disclaimer, the term of this patent is extended or adjusted under 35 U.S.C. 154(b) by 604 days.

(21) Appl. No.: 10/808,806

(22) Filed: Mar. 25, 2004

Related U.S. Application Data

(63) Continuation-in-part of application No. 10/247,877, filed on Sep. 19, 2002, now Pat. No. 6,733,936.

(51) Int. Cl.
*G03C 5/00* (2006.01)

(52) U.S. Cl. .................. 430/30; 430/311; 430/313; 430/322; 382/145

(58) Field of Classification Search ............. 430/30, 430/311, 313, 322; 382/145
See application file for complete search history.

(56) References Cited

U.S. PATENT DOCUMENTS 6,025,116 A    2/2000  Grassmann
6,187,506 B1   2/2001  Ding et al.
6,733,936 B1*  5/2004  Gu et al. .................. 430/30
2003/0148198 A1  8/2003  Lakkapragada et al.

OTHER PUBLICATIONS

Single wafer process to generate reliable swing, by Yiming Gu, Cynthia Zhu, John L. Sturtevant, *Proc. SPIE vol. 5038*, p. 832-840, Metrology, Inspection, and Process Control for Microlithography XVII; May 2003, Daniel J. Herr; Ed.

* cited by examiner

*Primary Examiner*—Christopher G. Young
(74) *Attorney, Agent, or Firm*—Glass & Associates; Kenneth Glass

(57) ABSTRACT

A method for determining photoresist thickness is disclosed that can be used in a semiconductor fabrication process. A layer of material is formed that has one or more common characteristic relative to the material in the layer that is to be patterned in the semiconductor fabrication process. A layer of photoresist is then formed that has varying thickness. The thickness of the layer of photoresist is determined at a plurality of different points. The layer of photoresist is exposed, developed and etched. The remaining structures are then analyzed to determine photoresist thickness to be used in the semiconductor fabrication process. The determined photoresist thickness is then used in the semiconductor fabrication process to form structures on a semiconductor wafer.

21 Claims, 17 Drawing Sheets

METHOD FOR DETERMINING PHOTORESIST THICKNESS AND STRUCTURE FORMED USING DETERMINED PHOTORESIST THICKNESS

CROSS-REFERENCE TO RELATED APPLICATIONS

This application is a continuation in part of application Ser. No. 10/247,877, entitled "METHOD FOR GENERATING A SWING CURVE AND PHOTORESIST FEATURE FORMED USING SWING CURVE," by Yiming Gu and John L. Sturtevant, filed on Sep. 19, 2002 now U.S. Pat. No. 6,733,936, which is incorporated herein by reference.

FIELD OF THE INVENTION

The present invention relates to the field of semiconductor devices. More specifically, the present invention relates to forming photoresist features on a semiconductor wafer.

BACKGROUND ART

The size of photoresist features vary with respect to photoresist thickness for a particular wafer substrate. Therefore, it is important to determine a photoresist thickness that will provide the desired photoresist feature size. Conventional processes for determining a thickness that will provide a desired photoresist feature size require the generation of a swing curve.

A swing curve is typically generated by preparing a dozen or more identical semiconductor wafers. The semiconductor wafers can be bare wafers or can have other layers and/or structures formed thereover. The layers and/or structures formed over the semiconductor wafer typically include those layers and/or structures that may affect photoresist feature size in the fabrication process. For example, when a photoresist layer is to be formed over a metal layer, the metal layer is deposited over each of the dozen or more semiconductor wafers.

The dozen or more semiconductor wafers are then placed in a photoresist coat track. Each wafer is then coated with the type of photoresist that is to be used in the semiconductor fabrication process. The track recipe for each wafer is different so as to coat each wafer with a different thickness of photoresist. The thickness of the photoresist is then measured on each of the dozen or more twelve semiconductor wafers.

All twelve semiconductor wafers are then exposed and developed so as to produce an identical photoresist feature on each of the dozen or more wafers. For each semiconductor wafer, the size of the photoresist feature is measured. The size of the photoresist feature is plotted relative to the photoresist thickness. Typically, thickness of photoresist is plotted on the x-axis and size of resist feature is plotted on the y-axis. A curve (swing curve) is then generated that fits the plotted points.

The process of generating a swing curve is typically expensive and time consuming due to the number of test wafers that must be fabricated and measured. Also, random or systematic process variation between wafers can result in the generation of a swing curve that is not accurate. When the swing curve is not accurate, costly fabrication defects occur, resulting in reduced yield and potentially resulting in device failure.

Thus, there is a need for a method for generating an accurate swing curve. In addition, there is a need for a method for forming a photoresist feature having a desired size. Moreover, there is a need for a method for determining photoresist thickness that can be used in a semiconductor fabrication process. The present invention meets the above needs.

DISCLOSURE OF THE INVENTION

The present invention provides a method for quickly and inexpensively generating an accurate swing curve. In addition, the present invention provides for forming a photoresist feature having a desired size. The present invention also provides for determining photoresist thickness that can be used in a semiconductor fabrication process to form a structure on a semiconductor substrate.

A method for generating a swing curve is disclosed in which a layer of photoresist having varying thickness is formed over a semiconductor wafer. In one embodiment, the swing curve is used to determine a desired optimum thickness for photoresist deposition. This thickness is then used in a semiconductor wafer fabrication process to form a photoresist layer having the desired thickness. The photoresist is then exposed and developed to produce photoresist features. Because the method of the present invention produces an accurate swing curve, the resulting features will have the desired size. Also, process latitude with respect to process variations is maximized. This minimizes manufacturing defects resulting from photoresist size variance, giving increased yield and reduced device failure.

In one embodiment of the present invention a method for determining photoresist thickness is disclosed. First, one or more layers of material are deposited over a semiconductor wafer. A layer of photoresist is formed that has varying thickness. The thickness of the layer of resist is determined at a plurality of locations. The layer of resist is exposed and developed. An etch process is then performed to form remaining photoresist structures and structures within the deposited layer(s) of material. The structures are analyzed to determine photoresist thickness that can be used in a semiconductor fabrication process.

The method of the present invention provides for accurately determining the minimum photoresist thickness that can be used to form a structure on a semiconductor substrate. Because the method of the present invention provides a more accurate indication of photoresist thickness than is obtained using prior art methods, structures having smaller feature sizes can be obtained. Also, process latitude with respect to process variations is maximized. This minimizes manufacturing defects resulting from photoresist size variance, giving increased yield and reduced device failure. Moreover, as a single wafer process is used, the method of the present invention results in significant cost savings as compared to prior art methods that use numerous wafers.

The method for determining photoresist thickness of the present invention can use a single semiconductor wafer. Thus, there is no need to prepare a dozen or more semiconductor wafers. Also, there is no need to deposit, expose, and develop photoresist and no need to measure features on each of the dozen or more semiconductor wafers as is required in prior art methods that use a swing curve. This results in significant savings in time and cost. Also, by using a single semiconductor wafer, process variation that results from generation of numerous test wafers is avoided. This gives a determined photoresist thickness that is more accurate than results from prior art methods.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
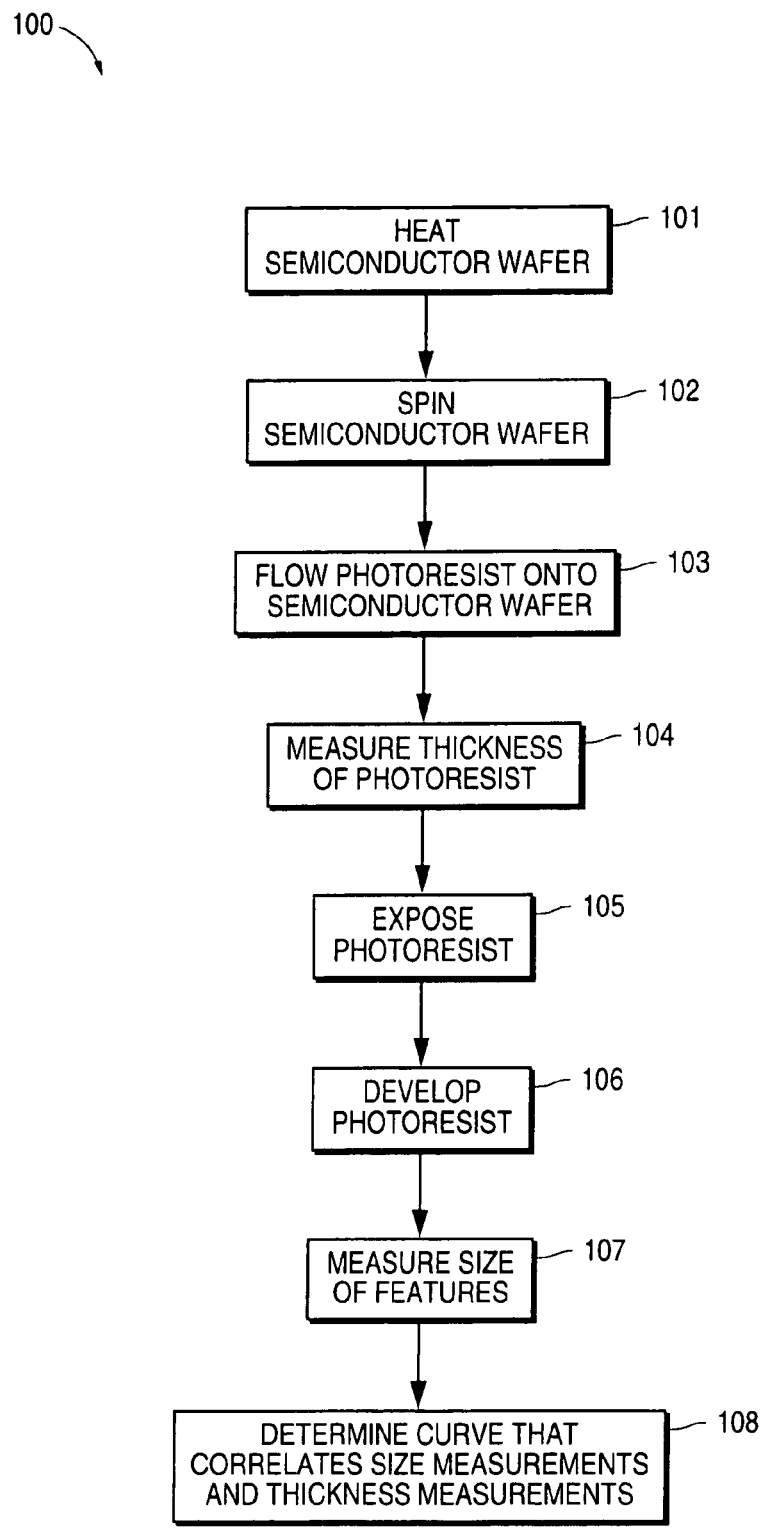
FIG. 1 is a flow chart that illustrates a method for forming a swing curve in accordance with one embodiment of the present invention.

FIG. 1 illustrates a method 100 for generating a swing curve. First, a layer of photoresist having varying thickness is formed over a semiconductor wafer. In the present embodiment, the layer of photoresist is formed in accordance with steps 101–103. However, it is appreciated that other methods could also be used for forming a layer of photoresist having varying thickness.

Referring now to step 101, the semiconductor wafer is heated. In one embodiment the semiconductor wafer is heated to a temperature of from 31 degrees centigrade to 51 degrees centigrade. However, other temperatures could be used, depending on the characteristics of the photoresist used and the conditions of the photoresist deposition process (e.g., steps 102–103).

In the present embodiment, the heated semiconductor wafer is placed in a resist coating unit that includes a mechanism for spinning the semiconductor wafer. This mechanism is activated and the semiconductor wafer begins spinning as shown by step 102.

Referring to step 103, as the semiconductor wafer spins, photoresist is deposited onto the semiconductor wafer. In the present embodiment, photoresist is deposited by flowing photoresist into the resist coating unit. In one embodiment, both the temperature of the photoresist and the internal temperature of the resist coating unit are less than the temperature of the top surface of the semiconductor wafer during step 103.

In the present embodiment, the temperature of the photoresist entering the resist coating unit has a temperature of room temperature. Also, the resist coating unit has an internal temperature of room temperature. However, alternatively, other temperatures of photoresist and other resist coating unit temperatures could be used.

In the present embodiment, the temperature of the semiconductor wafer is ten to twenty degrees centigrade hotter than the internal temperature of the resist coating unit and is ten to twenty degrees centigrade hotter than the temperature of photoresist entering the resist coating unit. Therefore, the semiconductor wafer, and in particular, the top surface of the semiconductor wafer cool as the semiconductor wafer spins. Because of the spinning of the wafer, the temperature of the top surface is highest proximate the center of the semiconductor wafer and decreases towards the edge of the semiconductor wafer. However, the temperature variation is not constant. Rather, the amount of temperature decrease increases towards the edges of the semiconductor wafer. This gives a relatively wide temperature range over the surface of the semiconductor wafer.

Because photoresist viscosity varies with temperature, the resulting semiconductor wafer will have a layer of photoresist formed thereover that has varying thickness. In the present embodiment, the layer of photoresist formed over the semiconductor wafer will be thinnest at the center of the semiconductor wafer (because the center is hotter) and will have increasing thickness towards the edges of the semiconductor wafer.

Figure 2:
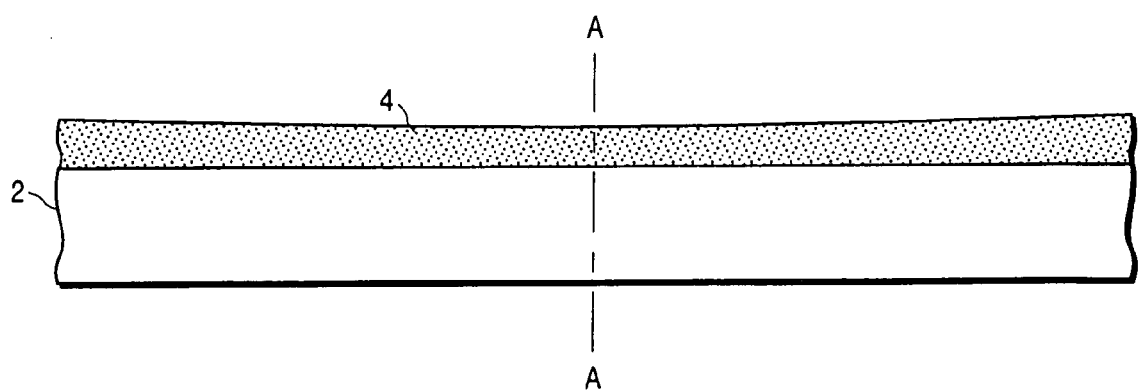
FIG. 2 shows a cross-sectional view that illustrates a photoresist layer having varying thickness and that is formed over a semiconductor wafer in accordance with one embodiment of the present invention.

FIG. 2 shows an exemplary layer of photoresist 4 formed in accordance with steps 101–103 of FIG. 1. Layer of photoresist 4 has varying thickness. More particularly, layer of photoresist 4 is thinner at the center of wafer 2 and is thicker towards the edges of wafer 2.

Figure 3:
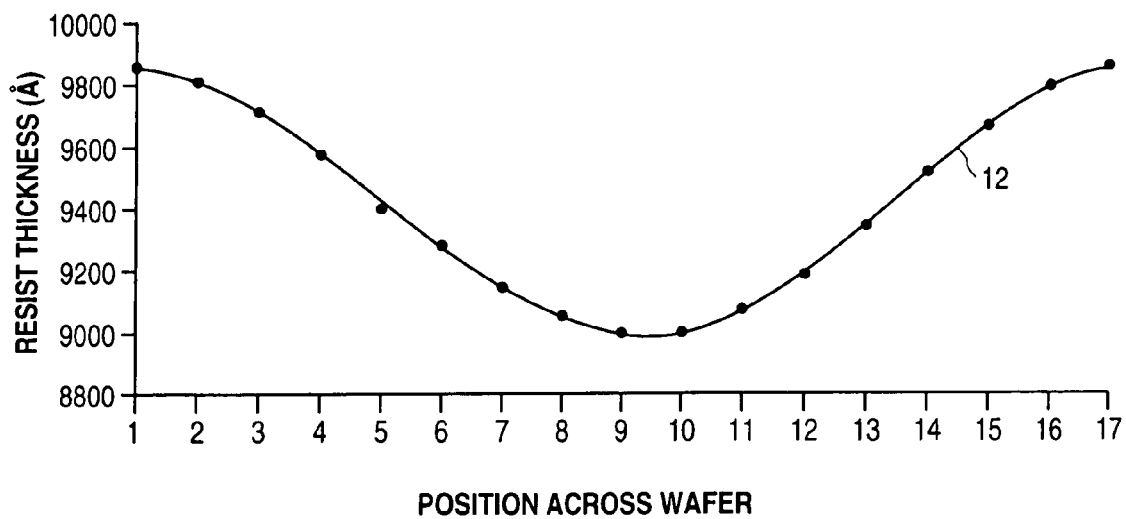
FIG. 3 is a diagram that shows thickness of the photoresist layer of FIG. 2 versus position across the semiconductor wafer in accordance with one embodiment of the present invention.

FIG. 3 illustrates a photoresist thickness profile 12 for layer of photoresist 4 for an IX-875 photoresist (from JSR Microelectronics, INC.) that is heated in step 101 to a temperature of 35 degrees centigrade and that is coated with photoresist using a spin speed of 2300 revolutions per minute. Position across the wafer is plotted along centerline A—A of FIG. 2 with each increment of position being 9.92 millimeters. The thickness varies from 9000 angstroms to over 9800 angstroms, giving a variation in thickness across the wafer of more than 800 angstroms. Accordingly, the single semiconductor wafer 2 has a wide thickness variance across the wafer. This thickness range is sufficient for generating a good swing curve using a single semiconductor wafer.

Continuing with FIG. 1, as shown by step 104, the thickness of the layer of photoresist is determined at a plurality of points. In the present embodiment, the points at which thickness is to be determined are chosen so as to provide a representative sample over a wide range of thicknesses. In one embodiment, twelve points are chosen that represent various thicknesses. In yet another embodiment, thirty to sixty points are chosen.

Although any of a number of different mechanisms can be used for determining points at which thickness is to be measured, in one embodiment, the top surface of the semiconductor wafer is divided using a grid of rows and columns based on the stepper/scanner job which will be used in feature patterning. Grids are then chosen that provide a range of thickness measurements and thickness is measured at the center of each chosen grid.

Figure 4:
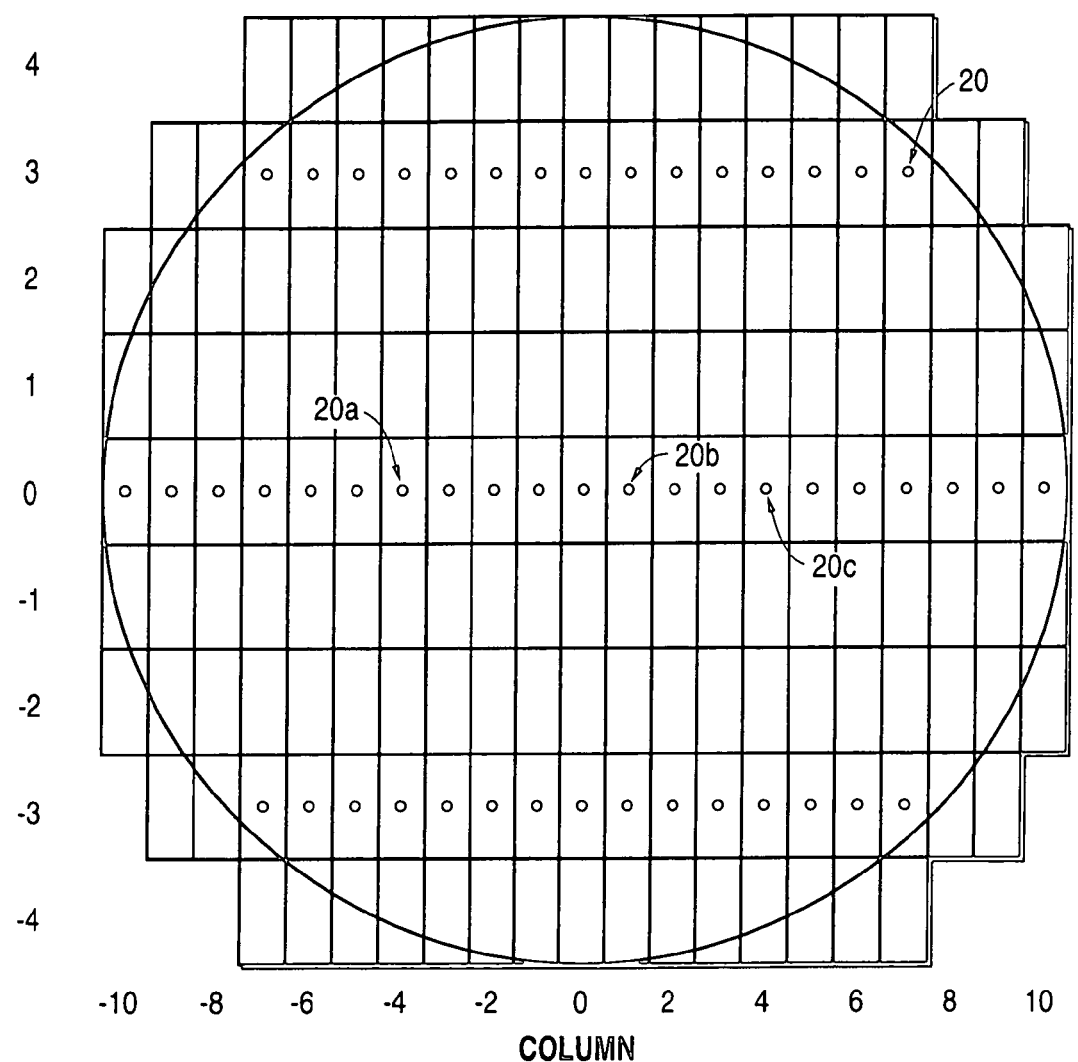
FIG. 4 is a diagram illustrating an exemplary grid disposed over a semiconductor wafer in accordance with one embodiment of the present invention.

In one embodiment, twelve grids are selected, giving twelve thickness measurements. In another embodiment, all grids having a center point that overlies the semiconductor wafer are chosen. In yet another embodiment that is illustrated in FIG. 4, the semiconductor wafer is divided into rows −4 through row 4 and columns −10 through 10. In this exemplary embodiment, all of the grids within row 0, all of the grids within row 3, and all of the grids within row −3 that have center points overlying the semiconductor wafer 2 are selected, for a total of 51 thickness measurements, indicated as thickness measurements 20.

Referring now to step 105 the photoresist is exposed. In the present embodiment, exposure step 105 is performed by aligning a mask over the semiconductor wafer. The mask and the semiconductor wafer are then exposed to i-line (365 nm) or deep ultraviolet light (e.g., 248 nm). Thereby, portions of the layer of photoresist are exposed to light.

The photoresist is then developed as is shown by step 106. The development process of step 106 will vary according to the type of photoresist used. In one embodiment, a wet development process is used in step 106. Alternatively, a dry development process is used.

Development process 106 produces a photoresist structure that includes a plurality of features. In one embodiment, the features produced by exposure step 105 and development step 106 are the same features as are to be used in subsequent production of semiconductor devices. Alternatively, the features formed in steps 105 and 106 are a test pattern of lines having a given size and density. Also, the features could be rounded shapes (e.g., for forming contacts), rectangles, squares or any other type of shapes that can be measured.

Figure 5:
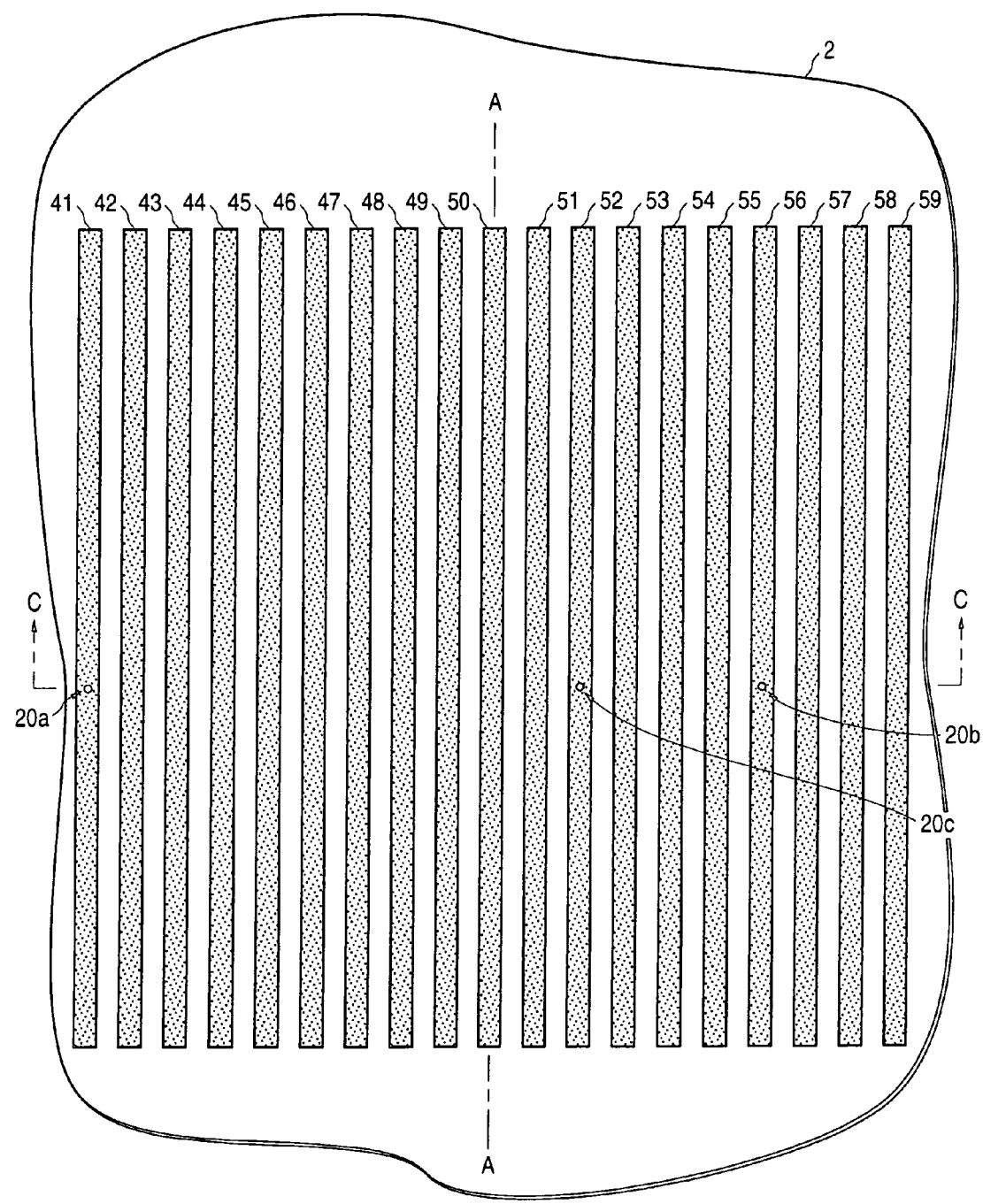
FIG. 5 is a top view of the structure of FIG. 2 after exposure and development steps have formed photoresist features thereover in accordance with one embodiment of the present invention.
Figure 6:
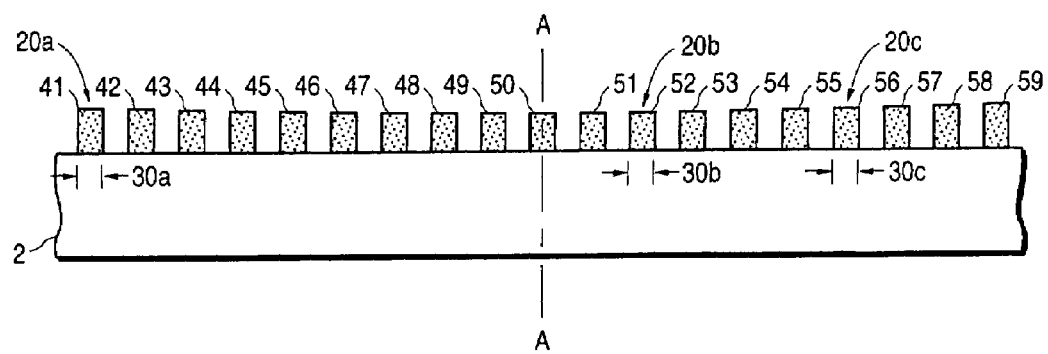
FIG. 6 is a cross-sectional view along cross section C—C of FIG. 5 in accordance with one embodiment of the present invention.

In the embodiment shown in FIGS. 5–6 steps 105–106 are shown to have formed features 41–59. In the present embodiment features 41–59 are lines having a size equal to the critical dimension for subsequent production of semiconductor devices and the line density is equal to the critical density for the production process.

Referring now to step 107, the size of a plurality of features is measured. In the present embodiment, for each point at which thickness of the photoresist layer is determined, the size of a corresponding feature is measured. In the present embodiment, when the point measured in step 104 is within a feature, that feature is chosen as the corresponding feature and the size of the feature is determined at the thickness measurement point. When the thickness measurement point is not within a feature, the size of the nearest feature is measured. Alternatively, the size of a nearby feature is determined. In the present embodiment, the size measurement is taken as close as possible to the corresponding thickness measurement point. Alternatively, the size measurement is taken at a location along the feature that is near the corresponding thickness measurement point.

In another embodiment, when a selected point 20 does not lie along a feature, that point is not used. This gives an embodiment in which all thickness measurement points 20 coincide with a feature.

As shown by step 108 of FIG. 1, a curve is determined that correlates size measurements and thickness measurements. In the present embodiment, a curve is determined that correlates the size measurements of step 107 and the thickness measurements of step 104. In one embodiment step 108 is performed by determining a mathematical equation that correlates the size measurements of step 107 and the thickness measurements of step 104. More particularly, in the present embodiment, the mathematical equation brings into mutual relation the size measurements and the thickness measurements.

Continuing with step 108, in the present embodiment, the mathematical equation is calculated using a computer program that operates on a computer. However, alternatively, the mathematical equation could be calculated without the use of a computer program or a computer. In one embodiment the mathematical equation is a polynomial that correlates size measurements and thickness measurements. In the present embodiment, the polynomial is a fourth-order polynomial. It has been found that a fourth-order polynomial gives a good fit to most sets of measured data. However, other orders of polynomial and other types of mathematical equations could be used.

In one embodiment, step 108 is performed by plotting size measurements versus thickness measurements to obtain a plurality of sample points. A curve is then generated that fits the sample points. The curve can be generated using a computer program that is operable on a computer or can be manually generated (e.g., by manually drawing a curve that fits the sample points).

It is appreciated that the curve can be determined with or without generating a visual display (e.g., a graph) that indicates the curve. One method for determining the curve that does not require generating a visual display is calculation of a mathematical function that correlates size measurements and thickness measurements. Alternatively, the curve can be determined by generating visual indicia that correlates size measurements to thickness measurements. This visible indicia can be a display on any device capable of generating a visual display (e.g., a computer monitor, a television, a projection device, etc.), and can be printed or handwritten media.

Figure 7:
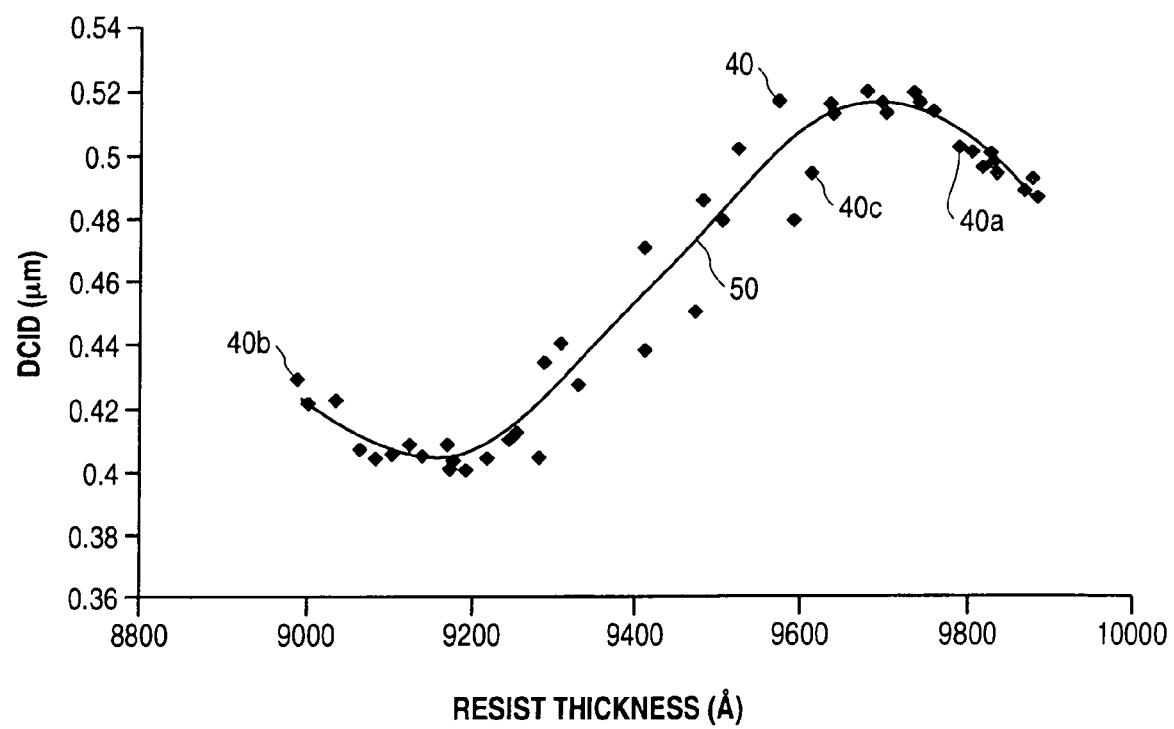
FIG. 7 is a diagram that illustrates a swing curve formed in accordance with one embodiment of the present invention.

FIG. 7 shows a graph that indicates each thickness measurement 20 and each corresponding size measurement 30. More particularly, each thickness measurement 20 is plotted along the x axis and the corresponding size measurement 30 is plotted along the y-axis, giving a sample point 40.

In the present embodiment, the curve is determined by plotting a curve that fits the sample points. Alternatively, a computer can be used to determine a curve that fits the sample points. In one embodiment, a polynomial is determined that correlates size measurements and thickness measurements. In one specific embodiment a fourth-order polynomial is determined that correlates size measurements and thickness measurements.

FIG. 7 illustrates an exemplary swing curve 50 formed in accordance with method 100 of FIG. 1 for an IX 875 photoresist processed using a numerical aperture of 0.48, a sigma of 0.625, an exposure of 190 millijoules and a 0.5 micrometer critical-dimension bar photoresist structure. In the present embodiment, each of size measurements 20 and thickness measurements 30 shown in FIGS. 5–8 are plotted to obtain sample points 40.

Following is an example in which three points 20a–20c shown in FIG. 4 are chosen for measurement. In step 104 the thickness of photoresist at each of points 20a–20c is measured. In one exemplary embodiment, the thickness of photoresist measured at point 20a is 9820 Angstroms, the thickness measured at point 20b is 9000 Angstroms, and the thickness measured at point 20c is 9600 Angstroms.

Now referring to FIGS. 5–6, point 20a lies within feature 41. Therefore, in step 107 the size of feature 41 is determined at point 20a, giving size measurement 30a. In the present embodiment, size measurement 30a is 0.5 µm. These values are then plotted in FIG. 7 to give sample point 40a. Point 20b lies within feature 52. Therefore, in step 107 the size of feature 52 is determined at point 20b, giving size measurement 30b. In the present embodiment, the size measurement 30b is 0.43 µm. These values are then plotted in FIG. 7 to give sample point 40b. Point 20c lies within feature 56. Therefore in step 107 the size of feature 56 is determined at point 20c, giving size measurement 30c. In the present embodiment, size measurement 30c is 0.493 µm. These values are then plotted in FIG. 7 to give sample point 40c. In a similar manner, each of the rest of thickness measurements 20 and size measurements 30 are plotted to obtain sample points 40.

In the present embodiment, the curve 50 is determined using a computer program that is operable on a computer. In one embodiment, the computer program determines a polynomial that fits sample points 40. In the present embodiment the polynomial is a fourth-order polynomial that represents a relationship between size measurements and thickness measurements. In this exemplary embodiment, curve 50 can be represented by the equation: $y=2E^{-13}x^4-8E^{-09}x^3+0.0001X^2-0.9111x+2383.5$. However, it is appreciated that other equations (e.g., equations with higher or lower orders of polynomials) could also be used to represent the relationship between size measurements and thickness measurements. Also, the curve fitting can be realized by using sine functions, cosine functions, hyperbolic functions, etc.

Figure 8:
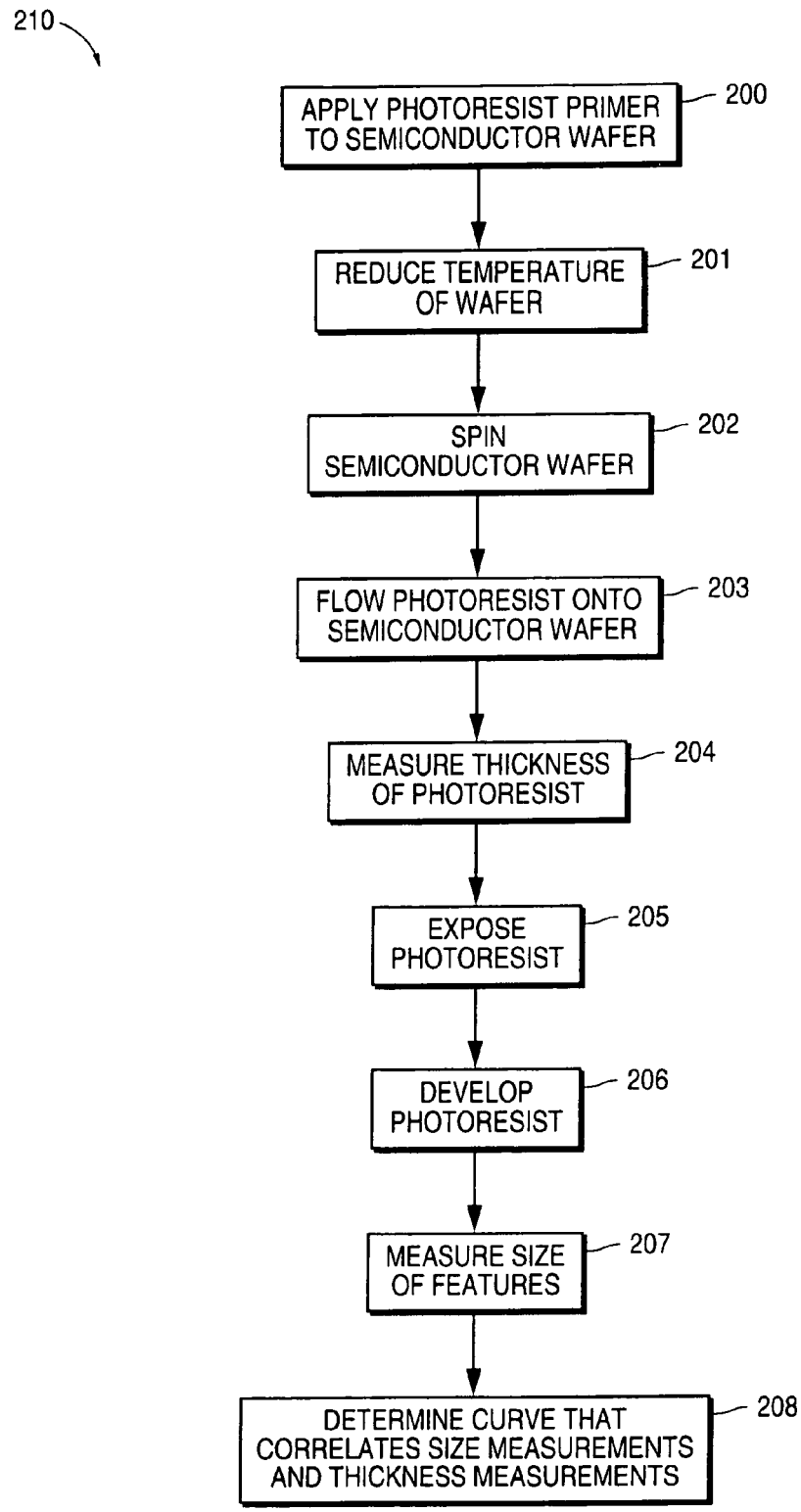
FIG. 8 is a flow chart that illustrates a method for forming a swing curve in which a vapor primer is used in accordance with one embodiment of the present invention.

FIG. 8 illustrates a method 210 for generating a swing curve in which a vapor primer is used. In the present embodiment, the vapor primer is Hexamethyidisilazane (HMDS) which promotes photoresist adhesion. As shown by step 201 the vapor primer (e.g., HMDS) is applied. In the present embodiment HMDS is applied to a semiconductor wafer having an elevated temperature. More particularly, the wafer is heated prior to or during the HMDS application process. In the present embodiment, the HMDS is applied to a wafer having a temperature of 110 to 115 degrees centigrade. The elevated wafer temperature gives a HMDS coating that provides good photoresist adhesion.

The temperature of the wafer is then reduced as shown by step 201. In the present embodiment, the temperature is reduced by placing the wafer on a chill plate in a resist coat track. In the present embodiment, a chill plate is used having a temperature of from 10 to 30 degrees above room temperature (31–51 degrees centigrade). Thereby, the temperature of the wafer is reduced to a temperature of from 31 to 51 degrees centigrade.

Accordingly, steps 200–201 result in a semiconductor wafer having an elevated temperature. The resulting semiconductor wafer is then processed in the same manner as is disclosed in steps 102–108 of FIG. 1. More particularly, photoresist is applied (step 203) to a spinning semiconductor wafer (step 202) and the thickness of the resulting layer of photoresist is measured at a plurality of points (step 204). The photoresist is then exposed (step 205), developed (step 206), and the size of features are measured (step 207). A curve is then determined that correlates size measurements and thickness measurements (step 208).

Because HMDS is typically applied to a semiconductor wafer at an elevated temperature, and because the temperature must be reduced prior to photoresist application, the method of FIG. 8 does not require any additional heating step. In the method of FIG. 8, only the temperature of the chill plate is altered (e.g., a chill plate having an elevated temperature is used instead of a room temperature chill plate as is used in prior art processes).

The swing curve determined in accordance with methods 100 and 210 of FIGS. 1 and 8 is determined using a single semiconductor wafer. Thus, there is no need to deposit, expose, and develop photoresist on numerous semiconductor wafers as is required in prior art methods for forming a swing curve. This results in significant savings in time and cost. Also, by using a single semiconductor wafer, process variation that results from generation of numerous test wafers is avoided. This gives a swing curve that is more accurate than swing curves produced using prior art methods.

Methods 100 and 210 utilize a single semiconductor wafer for determining a swing curve. However, multiple semiconductor wafers could also be used. In method 300 of FIG. 9, a method for generating a swing curve is illustrated in which two semiconductor wafers are used for generating a swing curve.

As shown by step 301 both a first semiconductor wafer and a second semiconductor wafer are heated. In the present embodiment, both semiconductor wafers are heated in the same manner as in step 101 of FIG. 1. Alternatively, both semiconductor wafers are heated, a HMDS coating is applied to the heated semiconductor wafers, and the temperature of both semiconductor wafers is reduced. In one embodiment, the HMDS process and the temperature reduction is performed in the same manner as in steps 200–201 of FIG. 8.

A layer of photoresist is deposited over both semiconductor wafers as shown by steps 302–303. More particularly, in the present embodiment, both semiconductor wafers are placed in a resist coating unit where photoresist is applied (step 303) to both spinning semiconductor wafers (step 302). In the present embodiment, the same resist coating unit is used and photoresist is deposited sequentially over both semiconductor wafers. This assures that process variation is minimized (e.g., variation from using different resist coating units and variation in a subsequent deposition processes).

In the present embodiment, the semiconductor wafers that are used are identical. Steps 302–303 form an identical layer of photoresist over each of the two semiconductor wafers. The resulting semiconductor wafers will then be identical, with an identical layer of photoresist having varying thickness formed over each semiconductor wafer.

The first semiconductor wafer is then used for determining thickness as is shown in step 304. More particularly, thickness is determined at a plurality of points on the first semiconductor wafer.

The second semiconductor wafer is exposed as shown by step 307 and is developed as shown by step 308. More particularly, portions of the layer of photoresist are exposed to light and portions of the layer of photoresist are removed, forming a photoresist structure that includes a plurality of features.

The second semiconductor wafer is then measured to determine feature size as is shown by step 307. In the present embodiment, for each of the points measured in step 304 on the first semiconductor wafer, the size of a corresponding feature on the second semiconductor wafer is measured. In the present embodiment, if the measurement point used for measuring the first semiconductor wafer is within a feature on the second semiconductor wafer, that feature is determined to be the corresponding feature and size is measured at or near the measurement point. If the measurement point is not within any feature on the second semiconductor wafer, a nearby feature (e.g., the nearest feature) is determined to be the corresponding feature and the size of that feature is determined near the measurement point.

As shown by step 308, a curve is determined that correlates size measurements and thickness measurements. In the present embodiment, the curve is determined using the thickness measurements (step 304) from the first semiconductor wafer and using the size measurements from the second semiconductor wafer (step 307).

Figure 9:
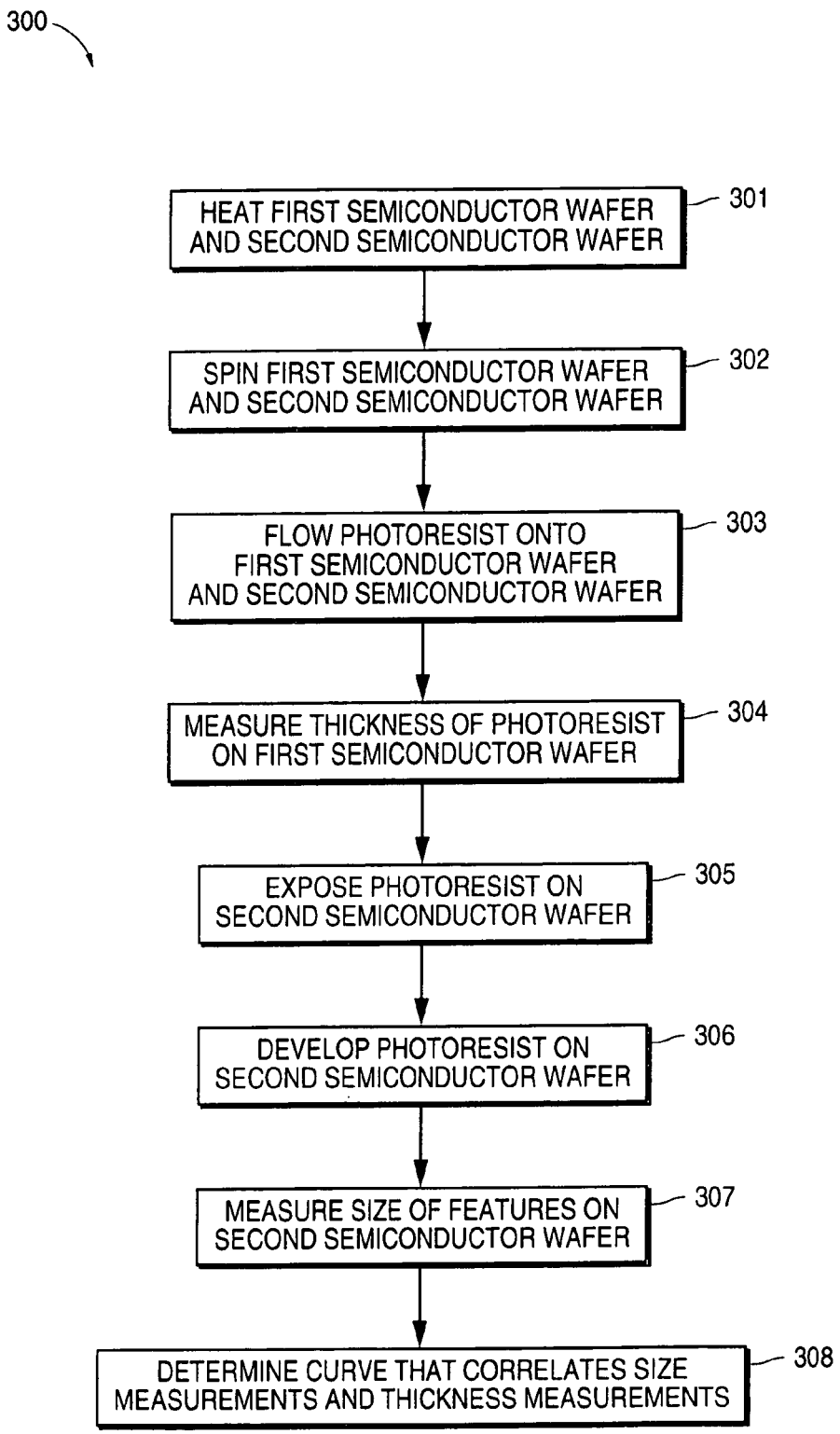
FIG. 9 is a flow chart that illustrates a method for forming a swing curve using two semiconductor wafers in accordance with one embodiment of the present invention.

Continuing with FIG. 9, in one embodiment, steps 301–308 are identical to steps 101–108 of FIG. 1 except that they are performed using two semiconductor wafers. More particularly, steps 301–303 are performed on both semiconductor wafers and are performed in the same manner as steps 101–103 of FIG. 1. Then thickness of photoresist is measured on the first semiconductor wafer (step 304) in the same manner as step 104 of FIG. 1. The second semiconductor wafer is then used to perform steps 305–307 in the same manner as in steps 105–107 of FIG. 1.

In the present embodiment, while the first semiconductor wafer is being measured (step 304), the second semiconductor wafer is processed in accordance with steps 305–307. This results in additional time savings as compared with use of a single semiconductor wafer as is shown in the methods of FIGS. 1 and 9. However, because of wafer to wafer process variation, the results may not be as accurate as is obtained using a single semiconductor wafer (method 100 of FIG. 1 and method 210 of FIG. 9).

The methods of FIGS. 1–9 can be used to determine a swing curve for a bare semiconductor wafer by performing process steps of methods 100, 210, and 300 to a bare semiconductor wafer or wafers. However, the methods of FIGS. 1–9 can also be used for determining a swing curve for a layer of photoresist that overlies some other layer or structure. More particularly, when a swing curve is needed for a photoresist layer that overlies some other layer or structure (e.g., a metal layer), a semiconductor wafer is used that includes the particular layer (e.g., the metal layer) or structure and the methods of steps 100, 210, and 300 are performed using the semiconductor wafer or wafers having the desired structure. The resulting swing curve will then reflect both the characteristics of the underlying layer or structure and the characteristics of the photoresist layer.

Figure 10:
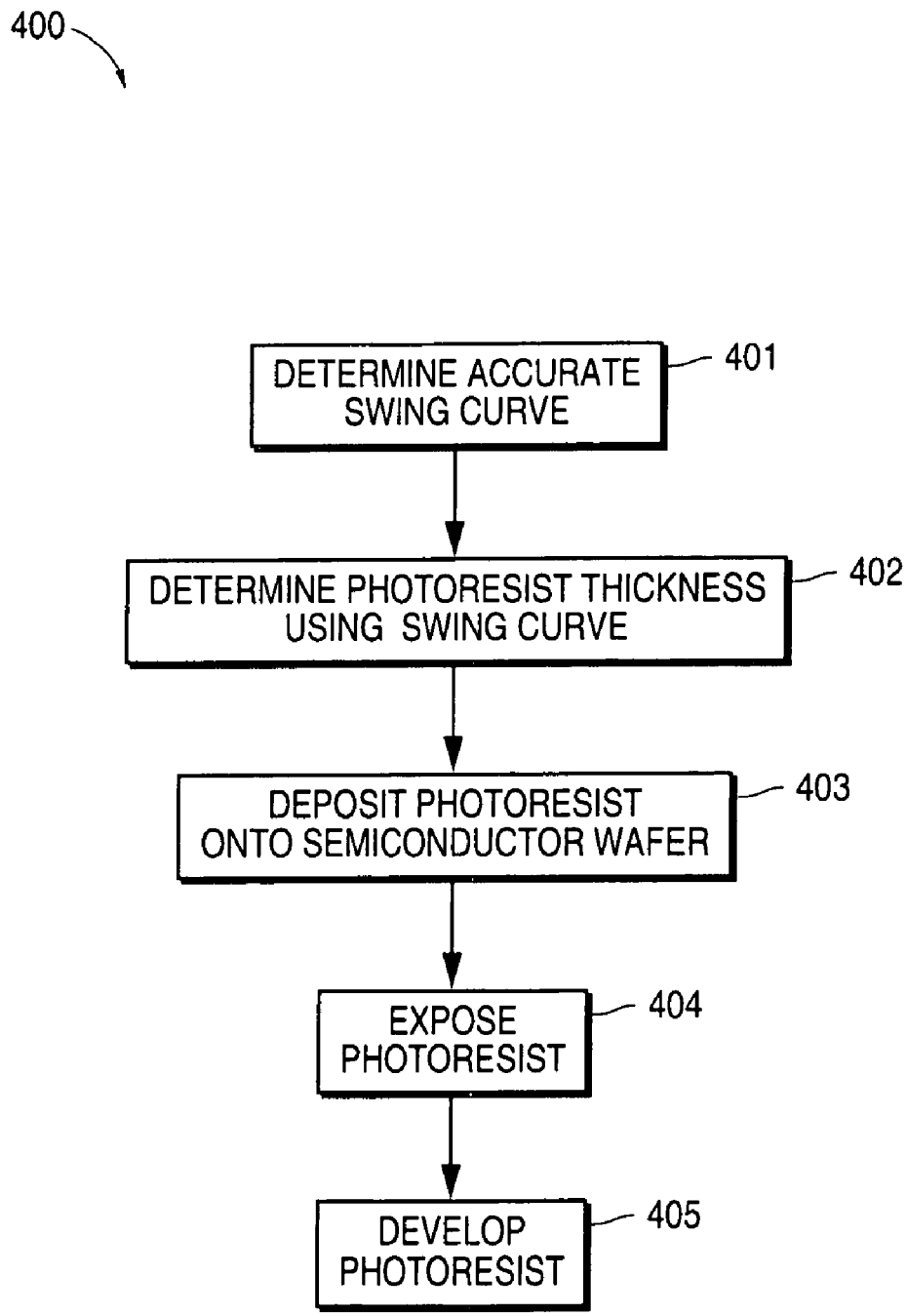
FIG. 10 is a flow chart that illustrates a method for forming a photoresist feature having a desired size in accordance with one embodiment of the present invention.

FIG. 10 illustrates a method 400 for forming photoresist features having a desired size. First, as shown by step 401 an accurate swing curve is determined using one of methods 100, 210, or 300.

As shown by step 402, photoresist thickness is determined using the swing curve. In the present embodiment, the type of feature and the critical dimension of the process determine the feature size or range of feature sizes that are desired. In the present embodiment, conventional methods are used for determining the location along the swing curve that provides the desired size characteristics.

The thickness determined in step 402 is then used to determine a thickness for photoresist deposition. As shown in step 403, a layer of photoresist is deposited that has the thickness determined in step 402. In the present embodiment the same type of photoresist is used as is used on the test wafer or wafers used in step 401 to determine the swing curve.

Referring now to steps 404 and 405, the photoresist is exposed (step 404) and is developed (step 405) to obtain features having the desired feature size. More particularly, because the swing curve used in step 401 is accurate, the features resulting from step 405 have a size that is accurate. Accordingly, the resulting features will have the desired feature size. Because features are obtained that have the desired feature size, fewer manufacturing defects and fewer device failures occur as compared to prior art processes.

In one embodiment, step 401 is performed using a single test wafer and steps 402–405 are performed in a manufacturing process for fabricating semiconductor devices. In an alternate embodiment, two test wafers are used for generating a swing curve (step 401) and steps 402–405 are performed in a manufacturing process for fabricating semiconductor devices.

Figure 11:
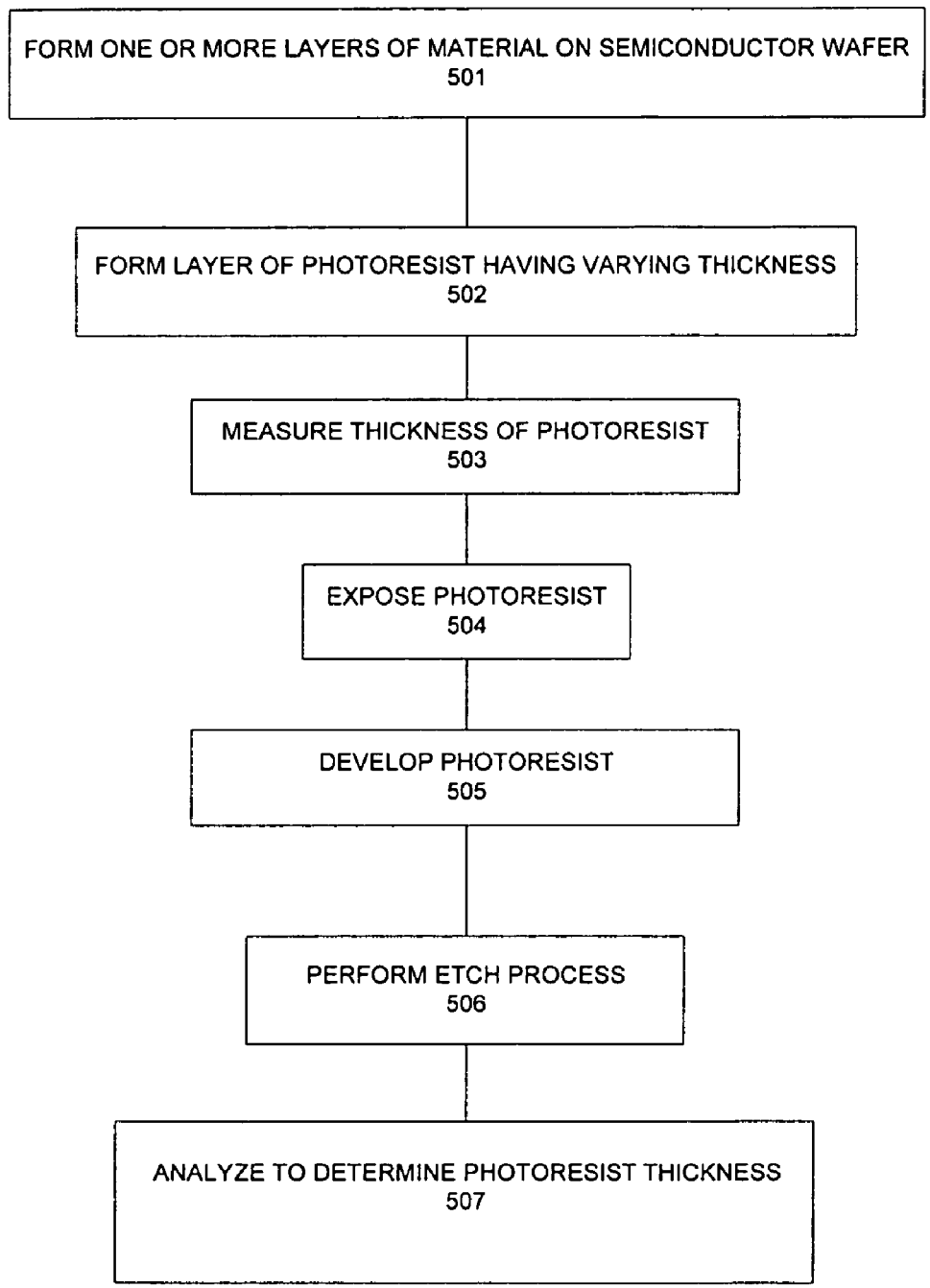
FIG. 11 is a flow chart that illustrates a method for determining photoresist thickness in accordance with one embodiment of the present invention.
Figure 12:
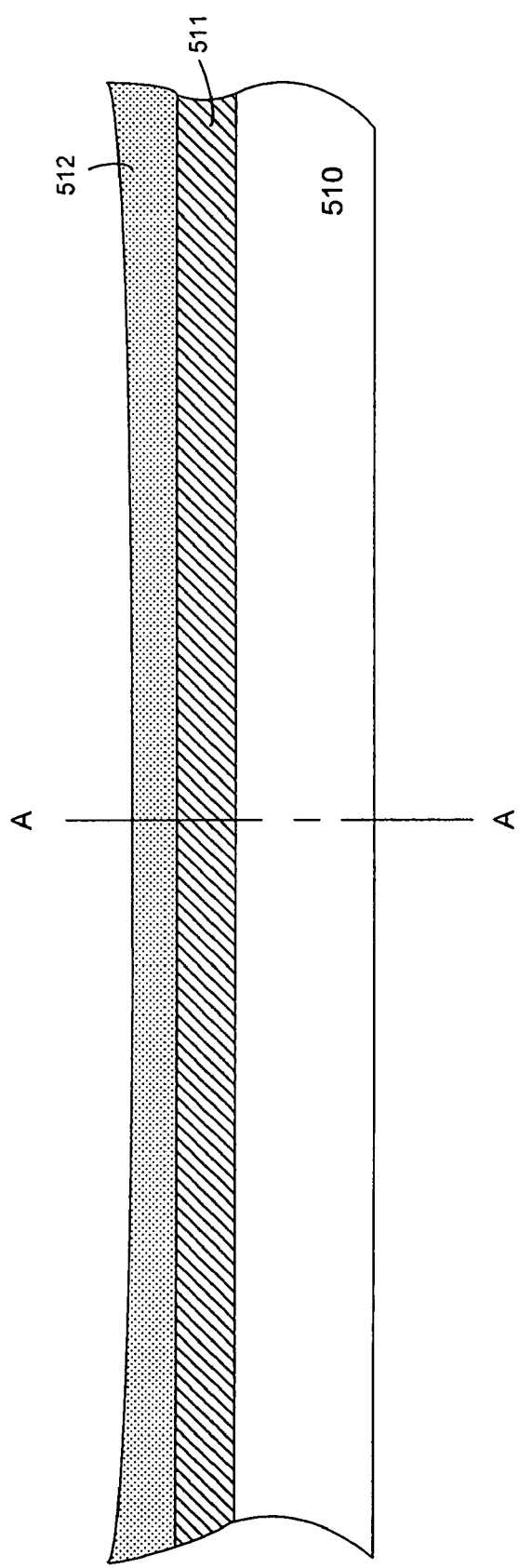
FIG. 12 is a cross-sectional view of a semiconductor wafer after a layer of material has been formed and after a layer of photoresist has been formed that has varying thickness in accordance with one embodiment of the present invention.
Figure 13:
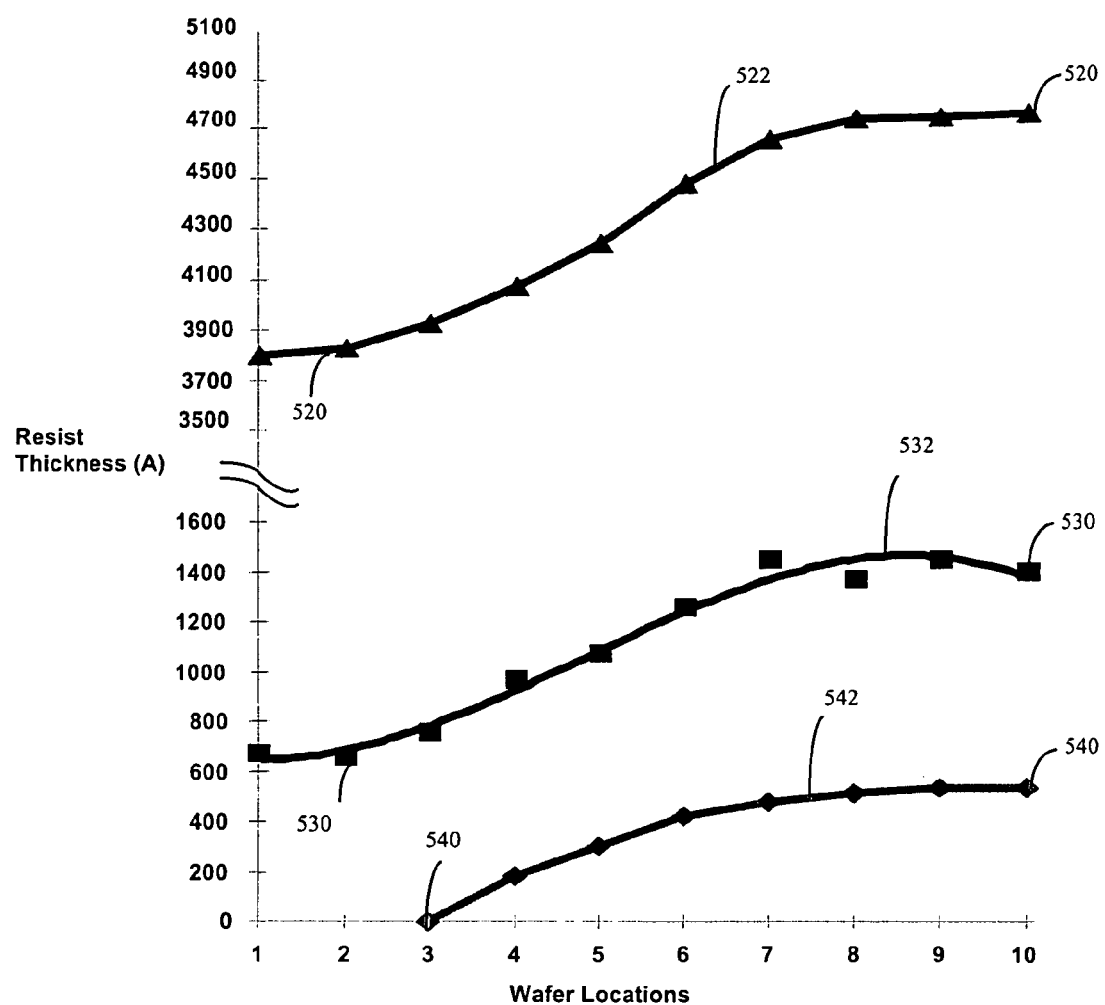
FIG. 13 is a diagram that illustrates photoresist thickness, remaining photoresist shoulder height, and remaining photoresist total height, for ten different locations on an exemplary semiconductor wafer formed in accordance with one embodiment of the present invention.

FIGS. 11–13 illustrate a method 500 for determining photoresist thickness to be used in a semiconductor fabrication process for patterning one or more layer of material. First, as shown by step 501 of FIG. 11 one or more layers of material is formed over a semiconductor wafer. In the present embodiment the material formed in step 501 is the same type of material; it has the same physical and chemical composition; and the same thickness as the material to be patterned in the semiconductor fabrication process. Alternatively, the material formed in step 501 has similar characteristics (e.g., similar type of material, similar physical composition, similar chemical composition, similar thickness, etc.)

As shown by step 502, a layer of photoresist is formed having varying thickness. In the present embodiment the layer of photoresist is formed in the same manner as in steps 101–103 of FIG. 1. Alternatively the photoresist layer is formed in the same manner as in steps 200–203 of FIG. 8. In the present embodiment the photoresist deposited in step 502 is the same type of photoresist; and it has the same physical and chemical composition as the material to be patterned in the semiconductor fabrication process.

FIG. 12 shows an embodiment in which layer 511 is formed in accordance with step 501 and photoresist layer 512 is formed in accordance with step 502. Photoresist layer 512 has varying thickness. More particularly, photoresist layer 512 is thinnest at the center of semiconductor wafer 510 and becomes thicker towards the edges of semiconductor wafer 510.

Figure 14:
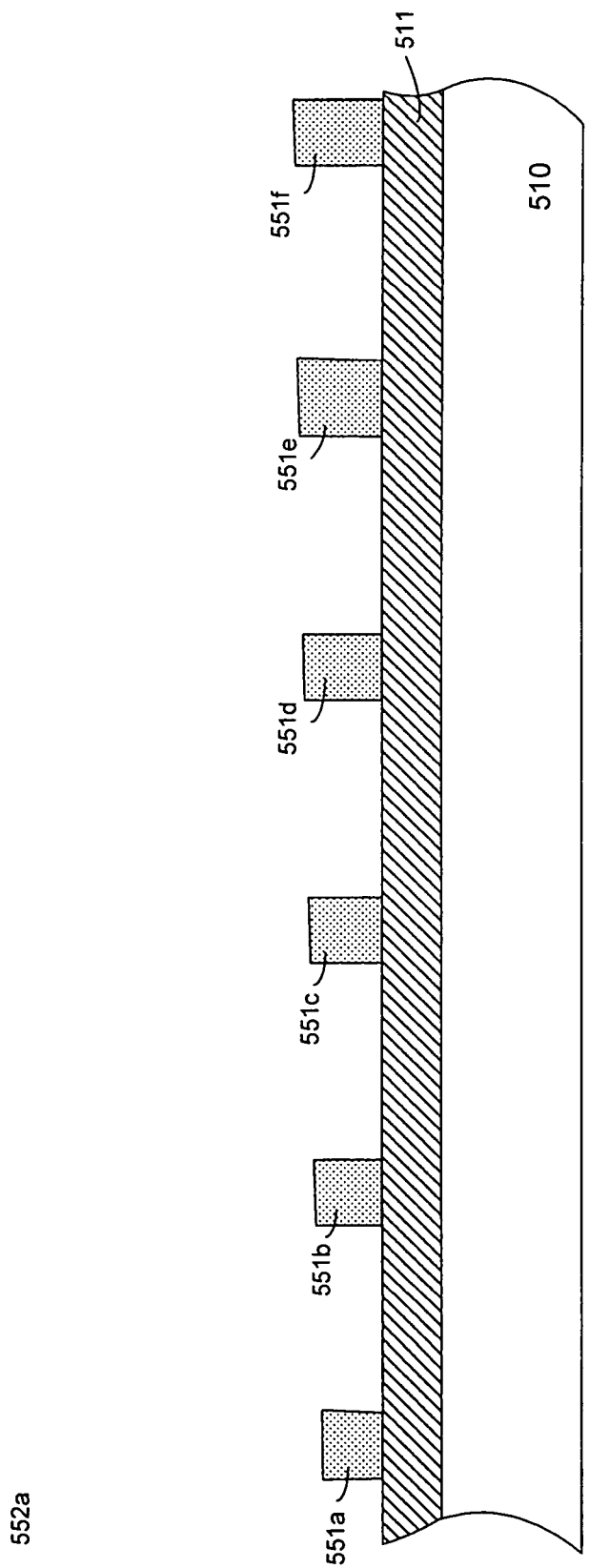
FIG. 14 is a cross-sectional view of the semiconductor wafer of FIG. 12 after exposure and development steps have been performed so as to produce photoresist structures in accordance with one embodiment of the present invention.

The thickness of photoresist layer 512 is measured as shown by step 503. Thickness can be measured in the same manner as in step 104 of FIG. 1. More particularly, the thickness of the layer of photoresist is determined at a plurality of points. In the present embodiment, the points at which thickness is to be determined are chosen such that each point will correspond to a structure to be subsequently formed (e.g., structures 551a–f, 552a–f, and 562a–f shown in FIGS. 14–15).

FIG. 13 shows determined thickness measurements 520 for an embodiment in which a Shipley UV210 photoresist is used and in which the material to be patterned is a 0.15 μm polysilicon gate. The determined thickness measurements 520 are plotted from the center to the edge of semiconductor wafer 510, with each of wafer locations 1–10 representing an additional 9.92 millimeters distance from the center of semiconductor wafer 510. Curve 522 that fits the determined thickness measurements illustrates thickness variation across wafer locations 1–10. The thickness of photoresist layer 512 varies from a thickness of approximately 3800 Angstroms to a thickness of approximately 4700 Angstroms, giving a total thickness variation across the wafer of 900 Angstroms.

Referring now to step 504 the photoresist is exposed. In the present embodiment, exposure step 504 is performed by aligning a mask over semiconductor wafer 510. The mask is exposed to i-line (365 nm) or deep ultraviolet light (e.g., 248 nm or 193 nm) such that portions of the photoresist layer 512 are exposed to light. In the present embodiment the photoresist exposure process of step 503 is the same as, or is similar to the process that is used in the semiconductor fabrication process for exposing the layer of photoresist that will be used to pattern the layer(s) of material. In the present embodiment the same type of stepper, the same exposure settings and the same wavelength of light are used that are used in the semiconductor fabrication process for exposing the layer of photoresist that will be used to pattern the layer(s) of material. In addition, the mask defines features that are the same as, or that are similar to, features to be formed in the semiconductor fabrication process. Alternatively, a test pattern of lines having a given width and density can be used where the width and density is the same as, or is similar to the width and density of the features in the mask to be used in the semiconductor fabrication process.

The photoresist is then developed as is shown by step 505 to form photoresist structures 551a–f. The development process of step 505 will vary according to the type of photoresist used. In one embodiment, a wet development process is used. Alternatively, a dry development process is used. In the present embodiment the development process of step 505 is the same as, or is similar to the process that is used in the semiconductor fabrication process for developing the layer of photoresist that will be used to pattern the layer(s) of material.

In one embodiment the measurement of the thickness of the layer of photoresist (step 503) is performed after the photoresist is patterned (step 504) and developed (step 505). This allows for directly measuring the thickness at each of structures 551a–f.

An etch process is performed as shown by step 506. In the present embodiment an etch process is used that is the same as, or similar to the etch process that is used in the semiconductor fabrication process to etch the patterned layer(s).

Figure 15:
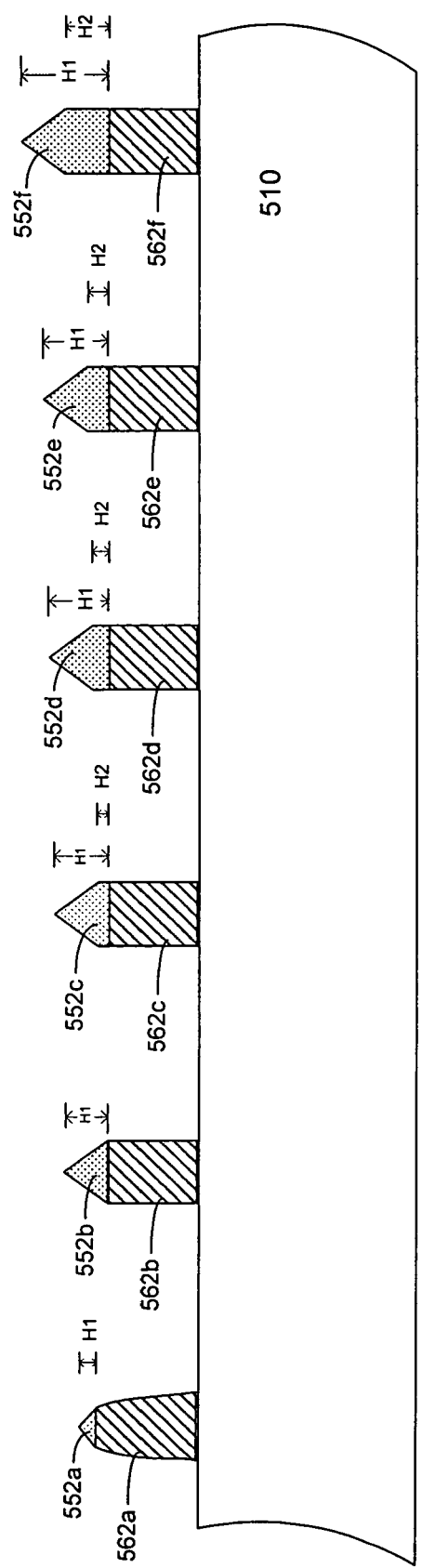
FIG. 15 is a cross-sectional view of the semiconductor wafer of FIG. 14 after an etch step has been performed so as to produce remaining photoresist structures and structures within the patterned layer of material in accordance with one embodiment of the present invention.

Referring now to FIG. 15, etch step 506 removes portions of layer 511 so as to form a pattered layer that includes structures 562a–f. Also, etch step 506 removes portions of resist features 551a–f, forming remaining resist structures 552a–f that extend over each of structures 562a–f.

The structure resulting from steps 501–506 are analyzed as shown by step 507 to determine the photoresist thickness to be used in the semiconductor fabrication process. In one embodiment, remaining photoresist structures 551a–f are analyzed to determine photoresist thickness. Alternatively, both remaining photoresist structures 551a–f and structures 562a–f are analyzed to determine photoresist thickness. In the present embodiment the semiconductor wafer is severed by sawing the wafer in half and the severed wafer is analyzed to determine photoresist thickness. This analysis can be done by direct viewing of the cross-section of the severed semiconductor wafer or by generating an image of the severed semiconductor wafer. The image can be generated, for example, using a scanning electron microscope.

In the present embodiment the semiconductor wafer is severed prior to analysis. However, it is appreciated that, alternatively, other methods (that do not require that the wafer be severed) could be used to analyze the photoresist structures. For example, images can be generated of the entire wafer that indicate the photoresist profile across a region of the semiconductor wafer. This could be accomplished using an image that gives a side view of the semiconductor wafer or an image that is taken at an acute angle relative to the top surface of the semiconductor wafer.

In one embodiment the analysis includes measuring total resist height H1 for some or all of remaining photoresist structures 552a–f and/or measuring shoulder height H2 for some or all of remaining photoresist structures 552a–f. FIG. 13 shows an exemplary embodiment in which total resist height 530 is plotted for wafer locations 1–10 and in which a curve 532 is shown that fits these total resist height 530 measurements. In addition, shoulder height 540 is plotted for wafer locations 1–10 and a curve 542 is shown that fits these total shoulder height 540 measurements.

In one embodiment the analysis includes determining the measured thickness corresponding to the thinnest photoresist structure that includes a shoulder. For example, in the embodiment illustrated in FIG. 15, remaining resist structure 552c is the thinnest photoresist structure that includes a shoulder. This thickness will be the nearest thickness measurement (obtained in step 503) that corresponds to structure 552c. This can be a thickness measurement taken at a point corresponding to structure 552c or the nearest thickness measurement taken relative to structure 552c. This thickness measurement can then be used as the minimum photoresist thickness for the semiconductor fabrication process.

Referring now to curves 522, 532 and 542 it can be seen that, while curve 532 corresponds closely to curve 522, curve 542 does not correspond as closely to curve 522. Accordingly, shoulder height does not directly correspond to thickness of the layer of photoresist. For this reason, when shoulder height is used to determine photoresist thickness, the methods of the present invention provide for a more accurate determination of photoresist thickness than prior art methods in which shoulder height is not used.

Alternatively, the analysis can include determination of the measured thickness corresponding to the thinnest remaining photoresist structure that does not exhibit "pattern erosion." For example, in the embodiment shown in FIG. 15, remaining photoresist structure 552a has collapsed, resulting in over-etch of structure 562a. Accordingly, structure 552b would be the thinnest photoresist structure that has not eroded. Accordingly, the thickness measurement (obtained in step 503) that corresponds to structure 552b will be the determined photoresist thickness. This thickness measurement can then be used as the minimum photoresist thickness for the semiconductor fabrication process.

In another embodiment, the analysis includes the determination of the measured thickness corresponding to the thinnest remaining photoresist structure that produces a remaining photoresist structure having a particular shoulder height H2. Alternatively, the analysis includes the determination of the measured thickness corresponding to the thinnest remaining photoresist structure that produces a remaining photoresist structure having a particular full height H1. The shoulder height H2 or the full height H1 that is desired can be chosen according to the variability in the etch process and/or according to other process parameters or process variation parameters.

In another embodiment in which the semiconductor devices to be fabricated can have some damage due to over-etch, the analysis includes the determination of the measured thickness corresponding to the thinnest remaining photoresist structure that produces a structure 562a–f in the patterned layer having a particular width. Alternatively, the analysis includes the determination of the measured thickness corresponding to the thinnest remaining photoresist structure that produces a structure 562a–f having a particular percentage loss in thickness (e.g., the maximum percentage loss allowable). For example, the pattern collapse in remaining photoresist structure 552a has produced a structure 562a that has a reduced width as compared to structures 562b–f. If the width of structure 562a is the minimum acceptable width, the measured thickness (step 503) corresponding to structure 562a will be the determined resist thickness.

In the present embodiment the determined photoresist thickness is described herein as being a minimum photoresist thickness to be used in a semiconductor fabrication process. However, it is appreciated that, depending on the characteristics of the semiconductor fabrication process, the determined photoresist thickness can take any of a number of different forms. It can be the minimum photoresist thickness allowed in the fabrication process, it can be average photoresist thickness for the semiconductor fabrication process, or it can be an etch window that is defined by the minimum and maximum photoresist thickness values that should be used. Similarly, it can be a single numerical value, multiple numerical values, or can be provided in graphical form. The term "determined photoresist thickness," as used in the present application includes each of these different ways of defining the photoresist thickness to be used in a semiconductor fabrication process and includes any other indicia of thickness that could be used to indicate the photoresist thickness to be used in a semiconductor fabrication process.

When the determined photoresist thickness is a minimum photoresist thickness, a process variation value (typically around ten percent) is added to the determined photoresist thickness to obtain the photoresist thickness to be used in the semiconductor fabrication process.

Figure 16:
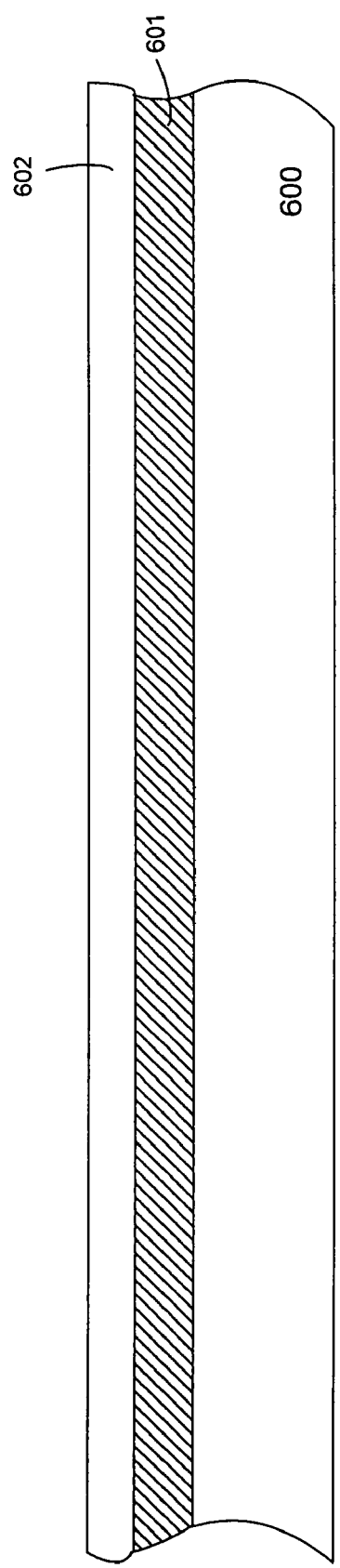
FIG. 16 is a cross-sectional view of a semiconductor wafer formed in a semiconductor fabrication process that includes one or more layers of material to be patterned and includes a layer of photoresist having a thickness that is approximately equal to the determined photoresist thickness in accordance with one embodiment of the present invention.
Figure 17:
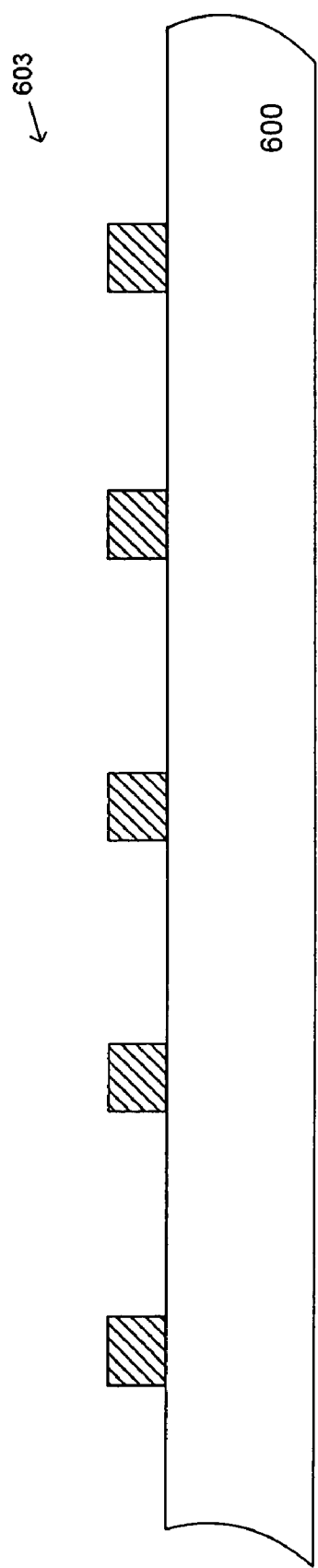
FIG. 17 is a cross-sectional view of the semiconductor wafer of FIG. 16 after an etch step has been performed so as to produce structures in the layer(s) of material to be patterned in accordance with one embodiment of the present invention.

The determined photoresist thickness is then used in a semiconductor fabrication process for determining photoresist thickness to be used to pattern a similar layer of material. FIGS. 16–17 illustrate an embodiment in which method 500 is used to pattern layers 601 in a semiconductor fabrication process. First layers 601 are formed over one or more semiconductor wafers. In the present embodiment layers 601 include an underlying layer of polysilicon and an upper layer of conductive material such as polycide that form a gate film stack. The determined photoresist thickness from method 500 is then used to form photoresist layer 602 that overlies layers 601. Photoresist layer 602 has a thickness that is approximately equal to the determined photoresist thickness from method 500. The photoresist is then exposed, developed and etched, so as to form structures 603 shown in FIG. 17. In the present embodiment structures 603 include gate structures and lines that connect to overlying structures so as to form integrated circuit devices on semiconductor substrate 600.

In the present embodiment the characteristics of method 500 are matched as closely as possible to the characteristics of the semiconductor fabrication process. More particularly, the material formed in step 501 is the same as or is similar to layers 601. Also, the photoresist deposited in step 502 is the same type of photoresist as photoresist layer 602. In addition, the photoresist exposure and development processes in steps 503–504 are the same as, or are similar to the processes that are used in the semiconductor fabrication process to pattern layer of photoresist 602. Moreover, the etch process used in step 506 is the same as, or is similar to the etch process that is used to form structures 603.

By matching the characteristics of the steps of method 500 to the production process a determined photoresist thickness is obtained that accurately reflects the parameters of the semiconductor fabrication process. Accordingly, the thinnest possible photoresist can be used in applications where minimizing feature size is desired, allowing for inexpensively and repeatedly forming features having small feature size.

In one embodiment, steps 501–507 are performed using a single test wafer. In an alternate embodiment, two test wafers are used. More particularly, steps 501 and 502 are preformed so as to form two identical test wafers. One test wafer is used for determining resist thickness (step 503) while the other test wafer is used for performing steps 504–507. In yet another embodiment, only the photoresist layer formed in step 502 is deposited over the test wafer that is to be used for determining resist thickness (step 503).

The method for determining photoresist thickness of the present invention provides for accurately determining the photoresist thickness that can be used to form a structure on a semiconductor substrate. Because the method of the present invention provides a more accurate indication of photoresist thickness than is obtained using prior art methods, structures having smaller feature sizes can be obtained. Also, process latitude with respect to process variations is maximized. This minimizes manufacturing defects resulting from photoresist size variance, giving increased yield and reduced device failure. Moreover, as a single wafer process is used, the method of the present invention results in significant cost savings as compared to prior art methods that use numerous wafers.

The method for determining photoresist thickness of the present invention can use a single semiconductor wafer. Thus, there is no need to prepare a dozen or more semiconductor wafers. Also, there is no need to deposit, expose, and develop photoresist and no need to measure features on each of the dozen or more semiconductor wafers as is required in prior art methods that use a swing curve. This results in significant savings in time and cost. Also, by using a single semiconductor wafer, process variation that results from generation of numerous test wafers is avoided. This gives a determined photoresist thickness that is more accurate than results from prior art methods.

The preferred embodiment of the present invention is thus described. While the present invention has been described in particular embodiments, it should be appreciated that the present invention should not be construed as limited by such embodiments, but rather construed according to the following claims.

What is claimed is:

1. A method for determining photoresist thickness comprising:
    forming a layer of material over a semiconductor wafer;
    forming a layer of photoresist having varying thickness over said layer of material;
    measuring thickness of said layer of photoresist at a plurality of points;
    exposing portions of said layer of photoresist to light;
    developing said layer of photoresist;
    performing an etch so as to form features in said layer of material, said etch removing portions of said layer of photoresist so as to form photoresist structures; and
    analyzing said photoresist structures to determine photoresist thickness.

2. A method as recited in claim 1 wherein said layer of photoresist is formed by depositing photoresist over said semiconductor wafer while said semiconductor wafer is spinning in a resist coating unit and while said semiconductor wafer has a temperature that is greater than an internal temperature of said resist coating unit.

3. A method as recited in claim 1 wherein said forming a layer of material further comprises forming a plurality of layers of material over a semiconductor wafer, said performing an etch removing portions of each of said layers of material.

4. A method as recited in claim 1 wherein said analyzing said photoresist structures further comprises determining the thickness of the thinnest photoresist structure that includes a shoulder.

5. A method as recited in claim 1 wherein said determined thickness comprises said determined thickness of the thinnest photoresist structure that includes a shoulder plus a process variation value.

6. A method as recited in claim 1 wherein said analyzing said photoresist structures to determine photoresist thickness further comprises:
    generating an image of said photoresist structures; and
    analyzing said image to determine photoresist thickness.

7. A method as recited in claim 6 wherein said generating an image further comprises:
    severing said semiconductor wafer; and
    generating an image of said severed semiconductor wafer.

8. In a semiconductor fabrication process in which a patterned layer is etched using a first etch process, a method for determining photoresist thickness to be used to form said patterned layer, said method comprising:
    forming a layer of material over a semiconductor wafer, said layer of material having one or more common characteristic relative said patterned layer;
    forming a layer of photoresist having varying thickness over said layer of material;
    measuring thickness of said layer of photoresist at a plurality of points;
    exposing portions of said layer of photoresist to light;
    developing said layer of photoresist;
    performing an etch using a second etch process so as to form features in said layer of material, said etch removing portions of said layer of photoresist so as to form photoresist structures; and
    analyzing said photoresist structures to determine photoresist thickness.

9. A method as recited in claim 8 wherein said common characteristic comprises composition.

10. A method as recited in claim 8 wherein said common characteristic comprises width.

11. A method as recited in claim 8 wherein said forming a layer of material further comprises forming a plurality of layers of material having one or more common characteristic relative said patterned layer, said performing an etch removing portions of each of said layers of material.

12. A method as recited in claim 8 wherein said etch uses the same type of etch process that is used in said semiconductor fabrication process to etch said patterned layer.

13. A method as recited in claim 11 wherein said first etch process uses approximately the same etch chemistry as said first etch process.

14. A method as recited in claim 8 wherein said analyzing said photoresist structures to determine photoresist thickness further comprises:
    generating an image of said photoresist structures; and
    analyzing said image to determine photoresist thickness.

15. A method as recited in claim 13 wherein said generating an image further comprises:
    severing said semiconductor wafer; and
    generating an image of said severed semiconductor wafer.

16. A patterned layer formed in accordance with the method of claim 8.

17. A method for forming a patterned layer comprising:
    forming a first layer of material over a first semiconductor wafer;
    forming a first layer of photoresist over said first layer of material, said first layer of photoresist having varying thickness;
    measuring thickness of said first layer of photoresist at a plurality of points;
    exposing portions of said first layer of photoresist to light;
    developing said first layer of photoresist;
    performing a first etch so as to form features in said first layer of material, said etch removing portions of said first layer of photoresist so as to form photoresist structures that overlie said features;
    analyzing said photoresist structures to determine photoresist thickness;

forming a second layer of material over a second semiconductor wafer, said second layer of material composed of the same material as said first layer of material;

forming a second layer of photoresist over said second layer, said second layer of photoresist having a thickness that is approximately equal to said determined photoresist thickness; and performing a second etch, said second etch removing portions of said second layer of material so as to form a patterned layer.

18. A method as recited in claim 17 wherein said first etch uses the same etch chemistry that is used in said first etch.

19. A method as recited in claim 18 wherein second layer of material has approximately the same thickness as said first layer of material.

20. A patterned layer formed in accordance with the method of claim 17.

21. A method for determining photoresist thickness comprising:

forming a layer of material over a first semiconductor wafer;

forming a layer of photoresist having varying thickness over said layer of material and forming a layer of photoresist having varying thickness over a second semiconductor wafer;

measuring thickness of said layer of photoresist formed on said second semiconductor wafer at a plurality of points;

exposing portions of said layer of photoresist formed on said first semiconductor wafer to light;

developing said layer of photoresist formed on said first semiconductor wafer;

performing an etch so as to form features in said layer of material, said etch removing portions of said layer of photoresist formed on said first semiconductor wafer so as to form photoresist structures; and analyzing said photoresist structures to determine photoresist thickness.

* * * * *